United States Patent
Gwin (10) Patent No.: US 10,262,716 B2
(45) Date of Patent: Apr. 16, 2019

(54) TEMPERATURE DEPENDENT MODES OF OPERATION OF A SEMICONDUCTOR MEMORY DEVICE

(71) Applicant: INTEL CORPORATION, Santa Clara, CA (US)

(72) Inventor: Paul J. Gwin, Orangevale, CA (US)

(73) Assignee: INTEL CORPORATION, Santa Clara, CA (US)

(*) Notice: Subject to any disclaimer, the term of this patent is extended or adjusted under 35 U.S.C. 154(b) by 8 days.

(21) Appl. No.: 15/798,231

(22) Filed: Oct. 30, 2017

(65) Prior Publication Data
US 2018/0088847 A1 Mar. 29, 2018

Related U.S. Application Data

(63) Continuation of application No. 15/279,290, filed on Sep. 28, 2016, now Pat. No. 9,804,796.

(51) Int. Cl.

| | |
|---|---|
| G11C 11/34 | (2006.01) |
| G06F 3/06 | (2006.01) |
| G11C 7/04 | (2006.01) |
| G11C 7/22 | (2006.01) |
| G11C 7/10 | (2006.01) |
| G06F 1/20 | (2006.01) |

(52) U.S. Cl.
CPC .............. *G11C 11/34* (2013.01); *G06F 1/206* (2013.01); *G06F 3/0625* (2013.01); *G06F 3/0634* (2013.01); *G06F 3/0655* (2013.01); *G06F 3/0679* (2013.01); *G06F 3/0688* (2013.01); *G11C 7/04* (2013.01); *G11C 7/1015* (2013.01); *G11C 7/22* (2013.01)

(58) Field of Classification Search
CPC .... G06F 3/0625; G06F 3/0634; G06F 3/0688; G06F 3/0655; G11C 7/04; G11C 7/22
See application file for complete search history.

(56) References Cited

U.S. PATENT DOCUMENTS

| | | | |
|---|---|---|---|
| 2009/0091996 A1 | 4/2009 | Chen et al. | |
| 2012/0066439 A1* | 3/2012 | Fillingim | G06F 11/3485 711/103 |
| 2016/0147291 A1* | 5/2016 | Thomas | G06F 1/3296 713/320 |

OTHER PUBLICATIONS

U.S. Appl. No. 15/279,290, entitled "Emergency Mode Operation of a Solid State Drive", by P,J, Gwin, filed Sep. 28, 2016, 33 pp. [77.357 (Appln)].

(Continued)

*Primary Examiner* — Ajay Ojha
(74) *Attorney, Agent, or Firm* — Konrad Raynes Davda & Victor LLP; Rabindranath Dutta (57) ABSTRACT

A first threshold temperature is maintained for operating a solid state drive (SSD) in a first mode. A second threshold temperature is maintained for operating the SSD in a second mode in which read and write operations are performed at a higher rate than in the first mode, wherein the second threshold temperature is higher than the first threshold temperature. The SSD is switched from the first mode to the second mode, in response to an operating temperature of the SSD exceeding the first threshold temperature.

25 Claims, 7 Drawing Sheets

(56) References Cited

OTHER PUBLICATIONS

Restriction Requirement for U.S. Appl. No. 15/279,290, dated Mar. 9, 2017, 7 pp. [77.357 (RestReq)].
Response to Restriction Requirement for U.S. Appl. No. 15/279,290, dated May 9, 2017, 8 pp. [77.357 (RespRestReq)].
Notice of Allowance for U.S. Appl. No. 15/279,290, dated Jun. 28, 2017, 11 pp. [77.357 (NOA)].

* cited by examiner

TEMPERATURE DEPENDENT MODES OF OPERATION OF A SEMICONDUCTOR MEMORY DEVICE

CROSS-REFERENCE TO RELATED APPLICATION

This application is a continuation of U.S. patent application Ser. No. 15/279,290, filed Sep. 28, 2016, which application is incorporated herein by reference in its entirety.

BACKGROUND

A solid state drive (SSD) is a data storage device that uses integrated circuit assemblies as memory to store data persistently. SSDs have no moving mechanical components and this distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and less latency. Many type of SSDs use NAND-based flash memory which retains data without power and is a type of non-volatile storage technology. NAND-based flash memory may include single-level cell (SLC) NAND, multi-level cell (MLC) NAND, triple level cell (TLC) NAND, etc.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

An SSD may have a normal operating temperature limit that maintains optimal life expectancy for the SSD. However, the SSD may also be able to operate at or below a predetermined higher than normal operating temperature for a predetermined short duration of time, at the cost of decreased life expectancy for the SSD. In certain situations, it may be desirable to complete pending input/output (I/O) operations including reads and writes to non-volatile memory in the SSD, even if the temperature of the SSD exceeds the normal operating temperature. However, the SSD should not be allowed to operate at a temperature that is above the predetermined higher than normal operating temperature for any duration of time, otherwise components in the SSD may undergo damage. Additionally, it may be preferable if the SSD is allowed to operate for no more than the predetermined short duration of time at a temperature that is above the normal operating temperature (while still operating at or below the predetermined higher than normal operating temperature).

In certain embodiments, a first threshold temperature is maintained for operating an SSD in a normal mode. A second threshold temperature is maintained for operating the SSD in an emergency mode in which read and write operations are performed at a higher rate than in the normal mode, where the second threshold temperature is higher than the first threshold temperature. In certain embodiments, the SSD is switched from the normal mode to the emergency mode to complete pending read and write operations in an accelerated manner, in response to an operating temperature of the SSD exceeding the first threshold temperature. In certain embodiments, the SSD is allowed to operate in the emergency mode for not more than a predetermined duration of time.

Figure 1:
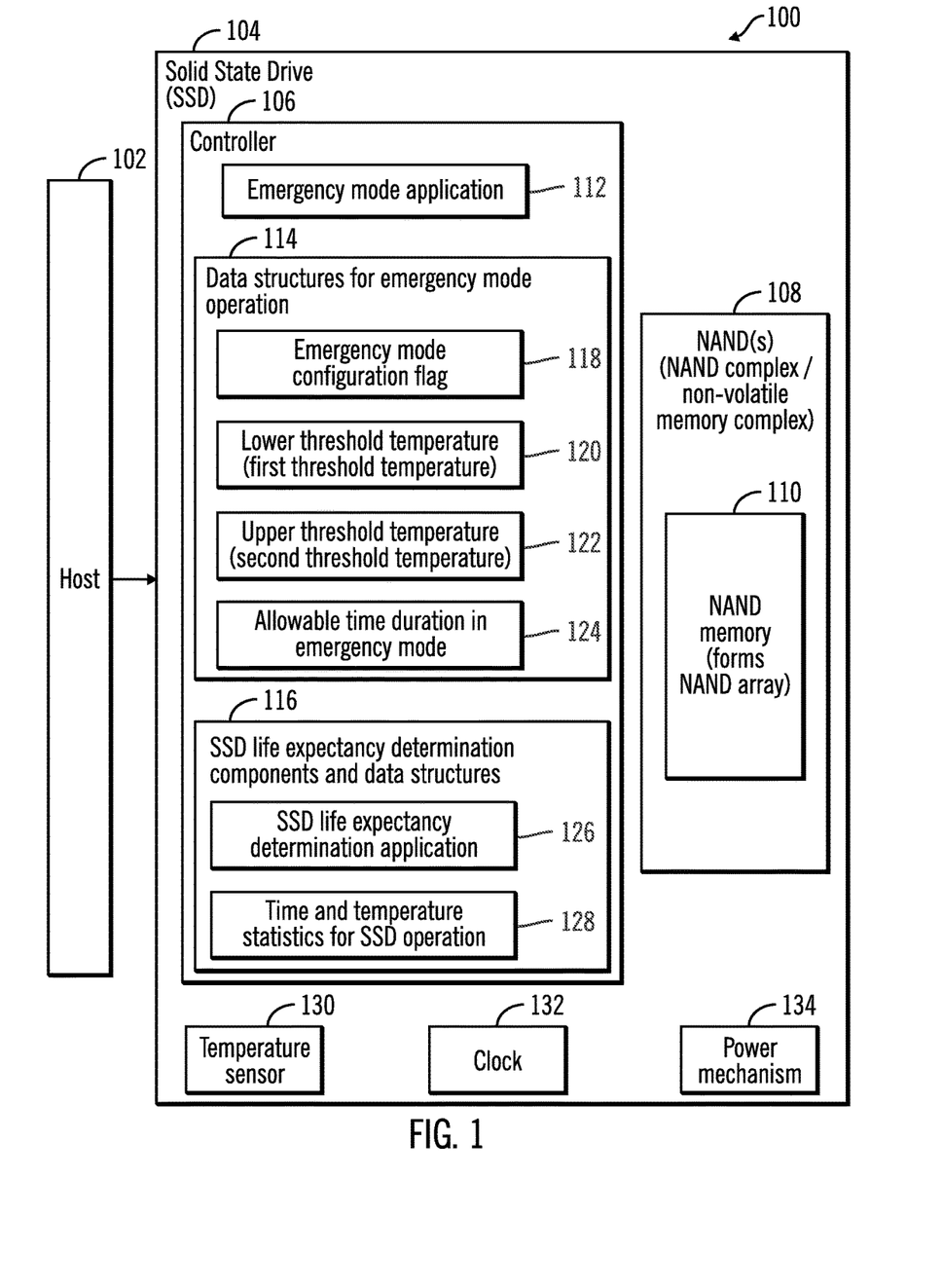
FIG. 1 illustrates a block diagram of a computing environment in which a host is coupled to an SSD, in accordance with certain embodiments.

FIG. 1 illustrates a block diagram of a computing environment 100 in which a host 102 performs I/O operations with an SSD 104, in accordance with certain embodiments. The SSD 104 may be comprised of a controller 106 and a NAND complex 108, where in certain embodiments the NAND complex 108 may be comprised of NAND memory that are part of NAND arrays (shown via reference numeral 110). In other embodiments the SSD 104 may be comprised of a controller 106 that controls certain other types of non-volatile memory, such as NOR memory or some other suitable non-volatile memory. It may be noted that certain embodiments may be implemented in an SSD that is made of non-volatile memory that includes NAND memory, NOR memory or any other suitable non-volatile memory. In other embodiments the non-volatile memory may be comprised certain other types of non-volatile memory, such as NOR memory or some other suitable non-volatile memory. Non-limiting examples of non-volatile memory may include any or a combination of: solid state memory [such as planar or three Dimensional (3D) NAND flash memory or NOR flash memory], storage devices that use chalcogenide phase change material (e.g., chalcogenide glass), byte addressable nonvolatile memory devices, three dimensional (3D) crosspoint memory, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, the 3D crosspoint memory may comprise a transistor-less stackable cross point architecture in which memory cells sit at the intersection of words lines and bit lines and are individually addressable and in which bit storage is based on a change in bulk resistance. In certain embodiments, an SSD with non-volatile memory may comply with one or more standards promulgated by the Joint Electron Device Engineering Council (JEDEC), such as JESD218, JESD219, JESD220-1, JESD223B, JESD223-

1, or other suitable standard (the JEDEC standards cited herein are available at www.jedec.org).

In certain embodiments, the controller 106 may be implemented via an application-specific integrated circuit (ASIC). In certain embodiments, the controller 106 may include logic implemented in hardware, firmware, software or any combination thereof to implement an emergency mode application 112, data structures for emergency mode operation 114, and SSD life expectancy determination components and data structures 116.

When an emergency configuration flag 118 is set (i.e., enabled) then the emergency mode application 112 performs operations to allow the SSD 104 to operate in between a lower threshold temperature 120 and an upper threshold temperature 122 for at most an allowable time duration 124, where the emergency mode configuration flag 118, the lower threshold temperature 120, the upper threshold temperature 122, and the allowable time duration in emergency mode 124 are shown as components of the data structures for emergency mode operation 114.

The SSD life expectancy determination components and data structures 116 is comprised of an SSD life expectancy determination application 126 that uses the time and temperature statistics for SSD operation 128 to determine the life expectancy of the SSD 104.

In certain embodiments, the host 102 may be comprised of any suitable computational device, such as a personal computer, a mainframe, a telephony device, a smart phone, a storage controller, a blade computer, a processor with memory, etc. In certain embodiments, the host 102 may communicate with the SSD 104 over a bus (such as a Peripheral Component Interconnect (PCIe), Serial Advanced Technology Attachment (SATA), Serial Attached Small Computer System Interface (SAS)) or a network, such as the Internet, a storage area network (SAN), a local area network (LAN), etc.

In addition to the controller 106 and the NAND complex 108, the SSD 104 also includes a temperature sensor 130 to measure temperature within the SSD 104, a clock 132 to keep track of time within the SSD 104, and a power mechanism 134 that may be used to provide power to the SSD 104.

Therefore, FIG. 1 illustrates certain embodiments in which an emergency mode application 112 may be activated for a predetermined allowable duration of time 124 to allow the SSD 104 to operate even when the temperature of the SSD 104 exceeds the lower threshold temperature 120, However, the temperature of the SSD 104 is not allowed to exceed the upper threshold temperature 122.

Figure 2:
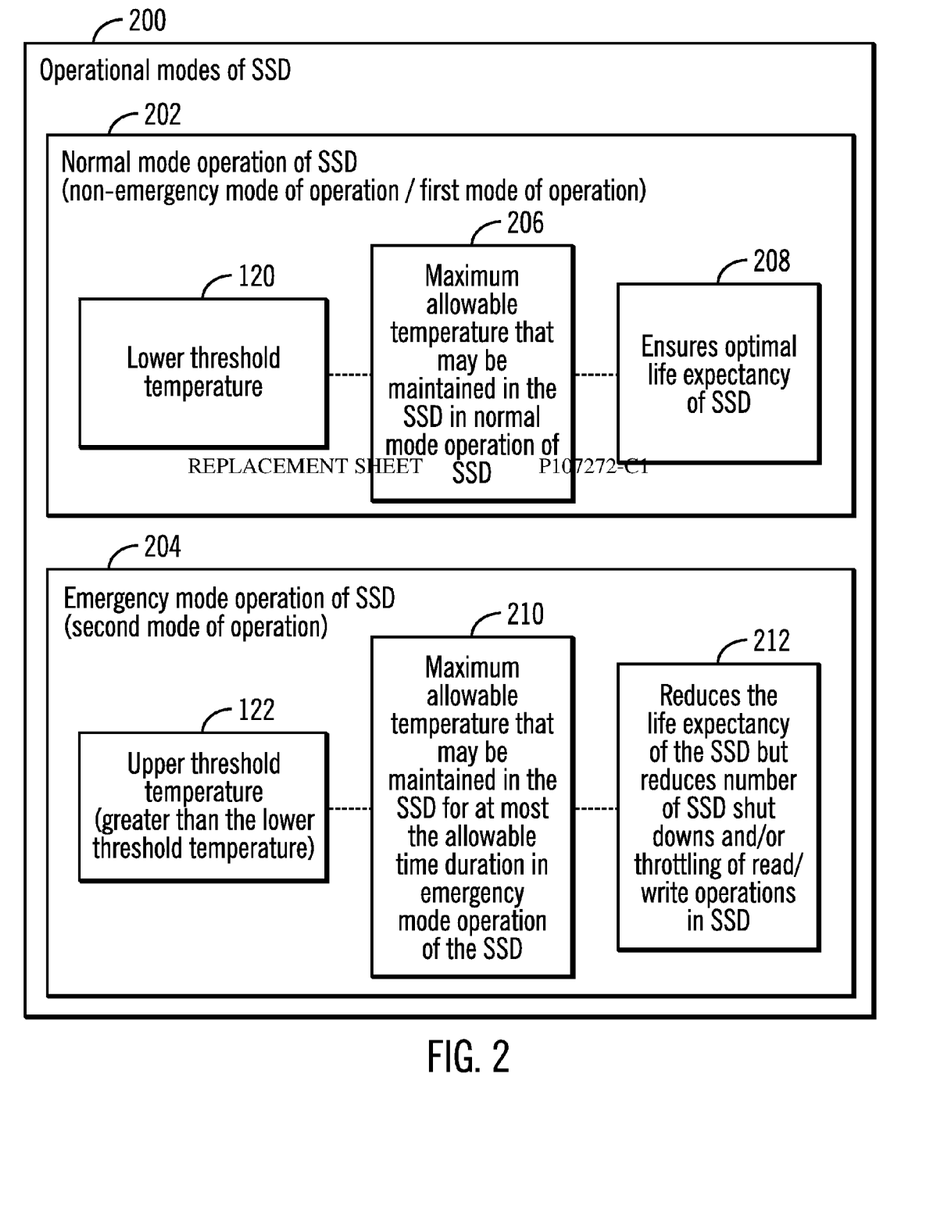
FIG. 2 illustrates a block diagram that shows various operational modes of the SSD, in accordance with certain embodiments.

FIG. 2 illustrates a block diagram 200 that shows various operational modes of the SSD 104, in accordance with certain embodiments. The SSD 104 is configurable to operate in a normal mode of operation 202 and in an emergency mode of operation 204. The normal node of operation 202 may also be referred to as a non-emergency mode of operation or a first mode of operation, and the emergency mode of operation 204 may be referred to as a second mode of operation.

In the normal mode of operation 202, the SSD 104 maintains the temperature within the SSD 104 to be at or below the lower threshold temperature 120. Therefore, the lower threshold temperature 120 is the maximum allowable temperature that may be allowed in the SSD 104 in the normal mode of operation of the SSD 104 (as shown via reference numeral 206). When the SSD 104 operates at or below the lower threshold temperature 120, the life expectancy (i.e., the lifespan) of the SSD 104 is optimized (as shown via reference numeral 208). In other words, when the SSD 104 operates at or below the lower threshold temperature 120, the components of the SSD 104 undergo less wear in comparison to operating at a temperature higher than the lower threshold temperature 120, and as a result the life expectancy of the SSD 104 is higher in comparison to operating the SSD 104 at temperatures higher than the lower threshold temperature 120. In certain embodiments the rate at which read and write operations are performed may be reduced in an attempt to maintain the SSD 104 in the normal mode of operation 202, as lowering the rate of read and write operations reduces the temperature of the SSD 202. The lowering of the rate of read and write operations is referred to as "throttling". In certain alternative embodiments in which the emergency mode configuration flag 118 is not set, the SSD 104 is not allowed to operate in the emergency mode 204 and if throttling is unable to maintain the temperature of the SSD 104 at or below the lower threshold temperature 120, then the SSD 104 may undergo a shutdown.

In the emergency mode of operation 204, the SSD 104 maintains the temperature within the SSD 104 to be at or below the higher threshold temperature 122, but above the lower threshold temperature 120. In certain embodiments, the higher threshold temperature 122 is the maximum allowable temperature that may be allowed in the SSD 104 for at most the allowable time duration 124 in the emergency mode 204 of operation of the SSD 104 (as shown via reference numeral 210). When the SSD 104 operates in the emergency mode 204, then the life expectancy of the SSD 104 is reduced in comparison to the operating the SSD 104 in the normal mode 202 (as shown via reference numeral 212). However, by allowing the SSD 104 to operate in the emergency mode 204 shutdowns and/or throttling of read/write operations in the SSD 104 may be reduced and pending I/O operations may be completed expeditiously by performing the pending I/O operations at rate that is greater than normal rate of performing the I/O operations. As a result, the pending I/O operations may be completed without a shutdown of the SSD or without throttling the I/O operations.

Figure 3:
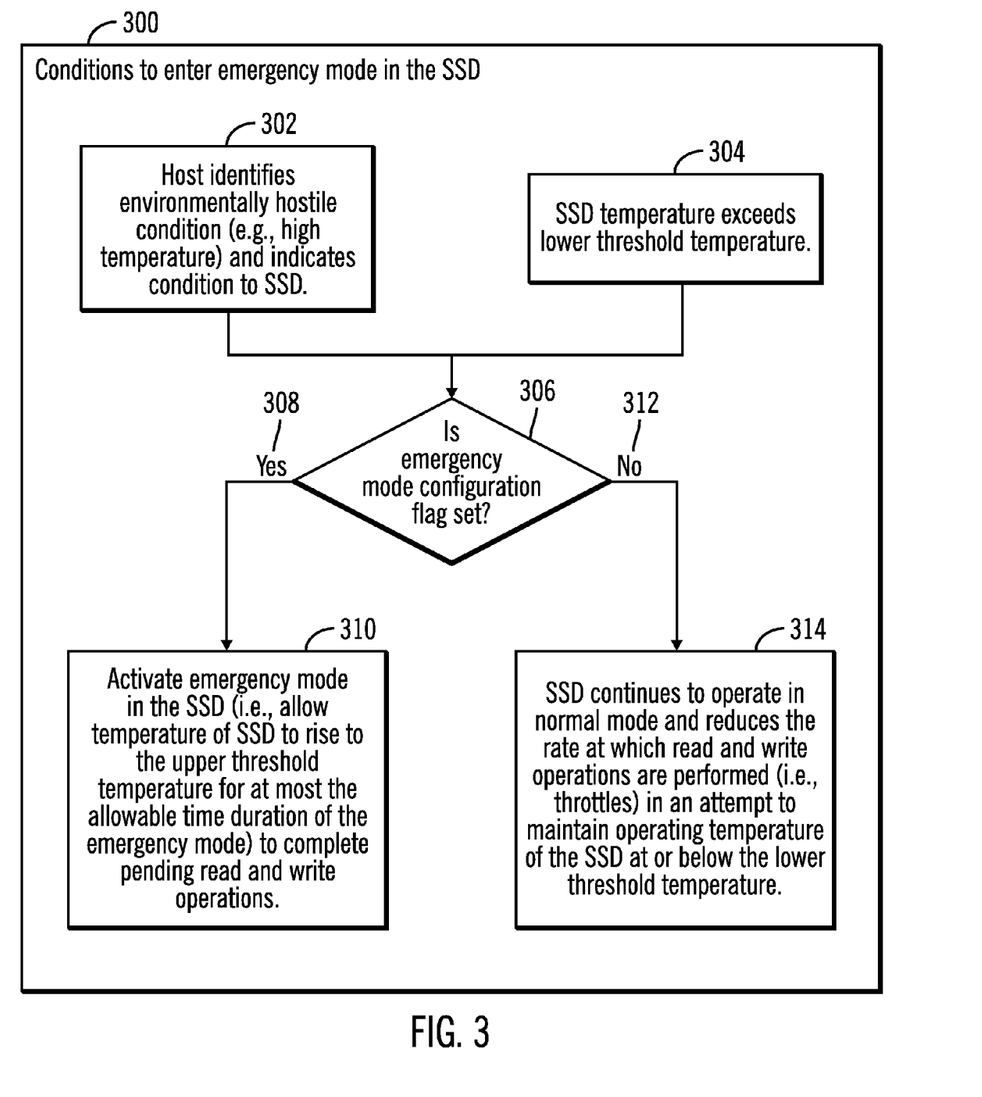
FIG. 3 illustrates flowchart that shows conditions to enter an emergency mode in the SSD, in accordance with certain embodiments.

FIG. 3 illustrates flowchart 300 that shows conditions to enter emergency mode 204 in the SSD 104, in accordance with certain embodiments. Certain of the operations shown in FIG. 3 may be performed by the controller 106 or other components in the SSD 104.

Control starts at block 302 in which the host 102 identifies an environmentally hostile condition (e.g., temperature higher than the lower threshold temperature 120) and indicates the condition to the SSD 104, and the SSD 104 receives the indication. Furthermore, based on the measurements of the temperature sensor 130 of the SSD, a determination may be made that the temperature of the SSD 104 exceeds the lower threshold temperature 120 (as shown via reference numeral 304).

From blocks 302 and 304 control proceeds to block 306, in which the emergency mode application 112 determines whether the emergency mode configuration flag 118 is set. If so ("Yes" branch 308), then the emergency mode 204 is activated (at block 310) in the SSD 104, and while the SSD 104 is in the emergency mode 204, the temperature of the SSD 104 is allowed to rise to the upper threshold temperature 122 for at most the allowable time duration 124, to complete pending read and write operations for the SSD 104.

If at block 306 a determination is made that the emergency mode configuration flag 118 is not set ("No" branch 312) then control proceeds to block 314 in which the SSD 104 continues to operate in normal mode 202 and reduces the rate at which read and write operations are performed (i.e., throttles) in an attempt to maintain the operating temperature of the SSD 104 at or below the lower threshold temperature 120.

Figure 4:
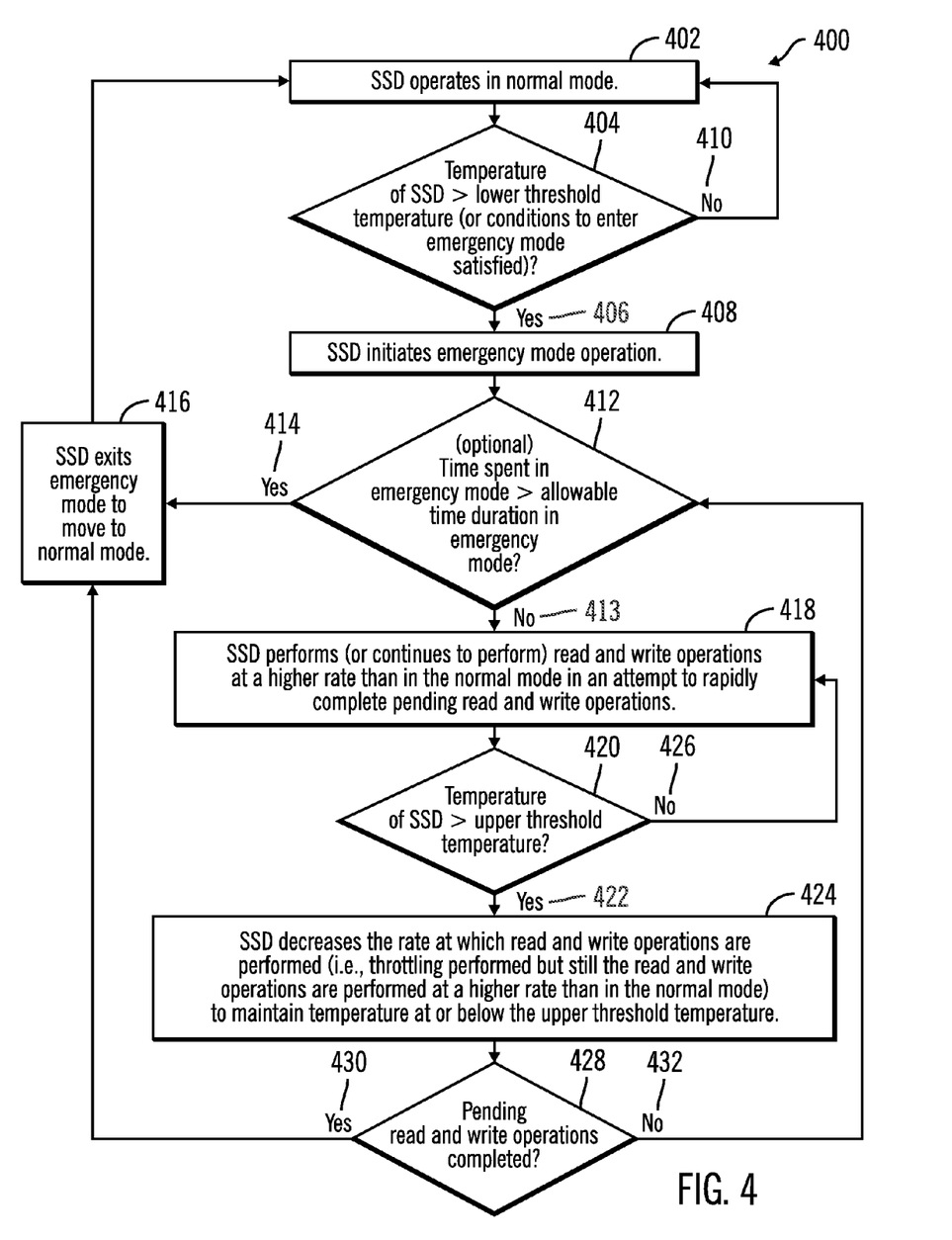
FIG. 4 illustrates a flowchart that shows operations performed in the emergency mode by the SSD, in accordance with certain embodiments.

FIG. 4 illustrates a flowchart 400 that shows operations performed in the emergency mode 204 by the SSD 104, in accordance with certain embodiments. Certain of the operations shown in FIG. 4 may be performed by the controller 106 or other components in the SSD 104.

Control starts at block 402 in which the SSD 104 operates in the normal mode 202. Control proceeds to block 404 in which a determination is made as to whether the temperature of the SSD 104 is greater than the lower threshold temperature 120 or other conditions (e.g., detection of a virus that necessitates shutting down the SSD 104) are satisfied to make the SSD 104 enter the emergency mode of operation. If so ("Yes" branch 406) control proceeds to block 408, and if not ("No" branch 410) control returns to block 402.

At block 408, the SSD 104 initiates the emergency mode 204 of operation. The emergency mode application 112 determines (at block 412) whether the time spent in the emergency mode 204 is greater than the allowable time duration 124 in the emergency mode. If so ("Yes" branch 414) the SSD 104 exits the emergency mode 204 and moves to the normal mode 202 (block 416), because otherwise the SSD 104 may be permanently damaged by operating at too high a temperature for an extended period of time.

If at block 412, the emergency mode application 112 determines that the time spent in the emergency mode 204 is not greater than the allowable time duration 124 in the emergency mode ("No" branch 413), then the SSD 104 performs (or continues to perform) read and write operations at a higher rate than in the normal mode 202 in an attempt to rapidly complete the pending read and write operations (at block 418).

From block 418, control proceeds to block 420 in which the emergency mode application 112 determines whether the temperature of the SSD 104 is greater than the upper threshold temperature. If so ("Yes" branch 422), the emergency mode application 112 decreases the rate at which read and write operations are performed (i.e., throttling is performed in the emergency mode 204 but still the read and write operations may be performed at a higher rate than in the normal mode 202) to maintain temperature at or below the upper threshold temperature 122 (at block 424). If not ("No" branch 426) control returns to block 418.

From block 424 control proceeds to block 428 in which it is determined whether pending read and write operations have been completed. If so ("Yes" branch 430) control returns to block 416, and if not ("No" branch 432) control returns to block 412.

Therefore, in embodiments shown in FIG. 4, the SSD 104 operates in an emergency mode 204 in which the rate of reads and writes are increased initially, but throttling of reads and writes are performed if the temperature exceeds the upper threshold temperature 122. The SSD 104 operates in the emergency mode 204 for no more than the allowable time duration 124.

In certain embodiments in which it is preferable to complete pending I/O operations in the emergency mode 204 without regard to the time spent in the emergency mode 204, the operations shown in block 412 are not performed and control proceeds directly from block 408 to block 418. In such embodiments, the SSD 104 may remain in the emergency mode 204 until all pending I/O operations are completed. However, throttling is still performed in the SSD 104 in the emergency mode 204 (at block 424) so that the temperature of the SSD 104 does not exceed the upper threshold temperature 122, as exceeding the upper threshold temperature 122 is likely to cause a failure in the SSD 104. The time spent to complete all the pending I/O's in a single activation of the emergency mode 204 is typically short in comparison to the total allowance of time for the SSD 104 to operate in a plurality of emergency modes over the lifetime of the SSD 104. Additionally, emergency mode of operations are relatively infrequent in comparison to the normal mode of operations for the SSD 104. In certain embodiments, if the SSD 104 is low on the remaining total allowance of time for the SSD 104 to operate in emergency modes over the lifetime of the SSD, then the SSD 104 may be replaced so that the total allowance of time for the SSD 104 to operate in emergency modes over the lifetime of the SSD 104 is not exceeded in the next emergency mode, or the operations of block 412 may be performed to limit the time to be spent in the next emergency mode.

Figure 5:
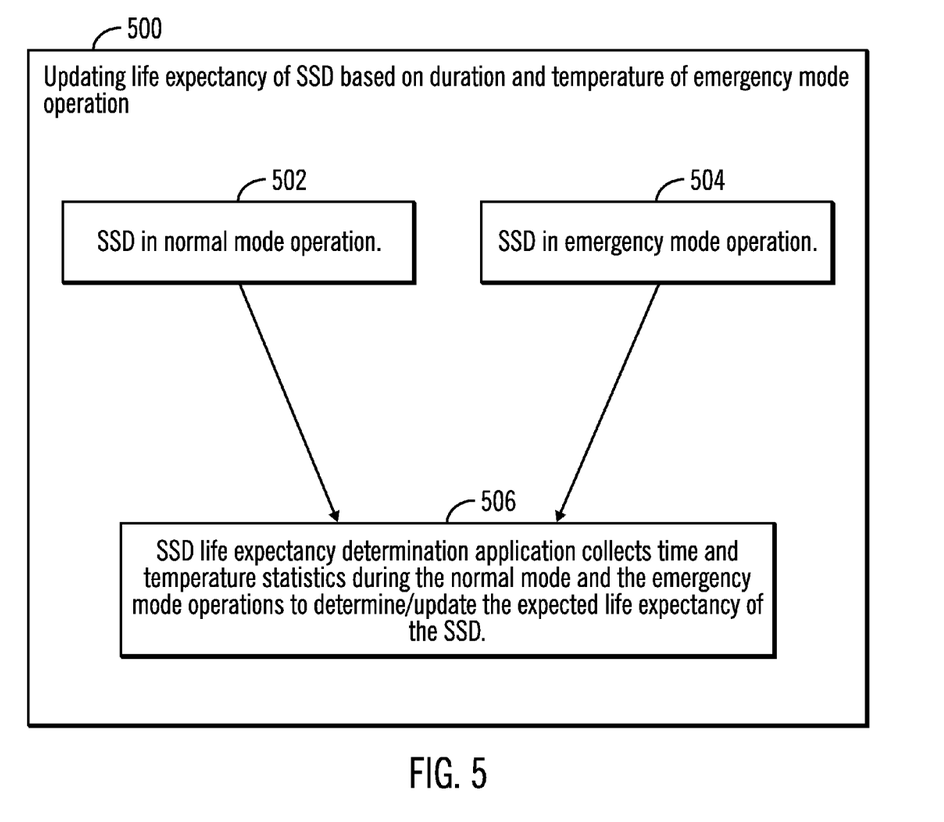
FIG. 5 illustrates a flowchart that shows operations for determining life expectancy of the SSD, in accordance with certain embodiments.

FIG. 5 illustrates a flowchart 500 that shows operations for determining life expectancy of the SSD 104, in accordance with certain embodiments. Certain of the operations shown in FIG. 5 may be performed by the SSD life expectancy determination application 126 that executes in the SSD 104 or via other components in the SSD 104.

Control starts at blocks 502 and 504 in which the SSD 104 is in a normal mode of operation 202 and an emergency mode of operation 204 respectively. The SSD life expectancy determination application 126 collects time and temperature statistics 128 during the normal mode of operations 202 and the emergency mode of operations 204 to determine and/or update the expected life expectancy of the SSD 104 (at block 506).

Figure 6:
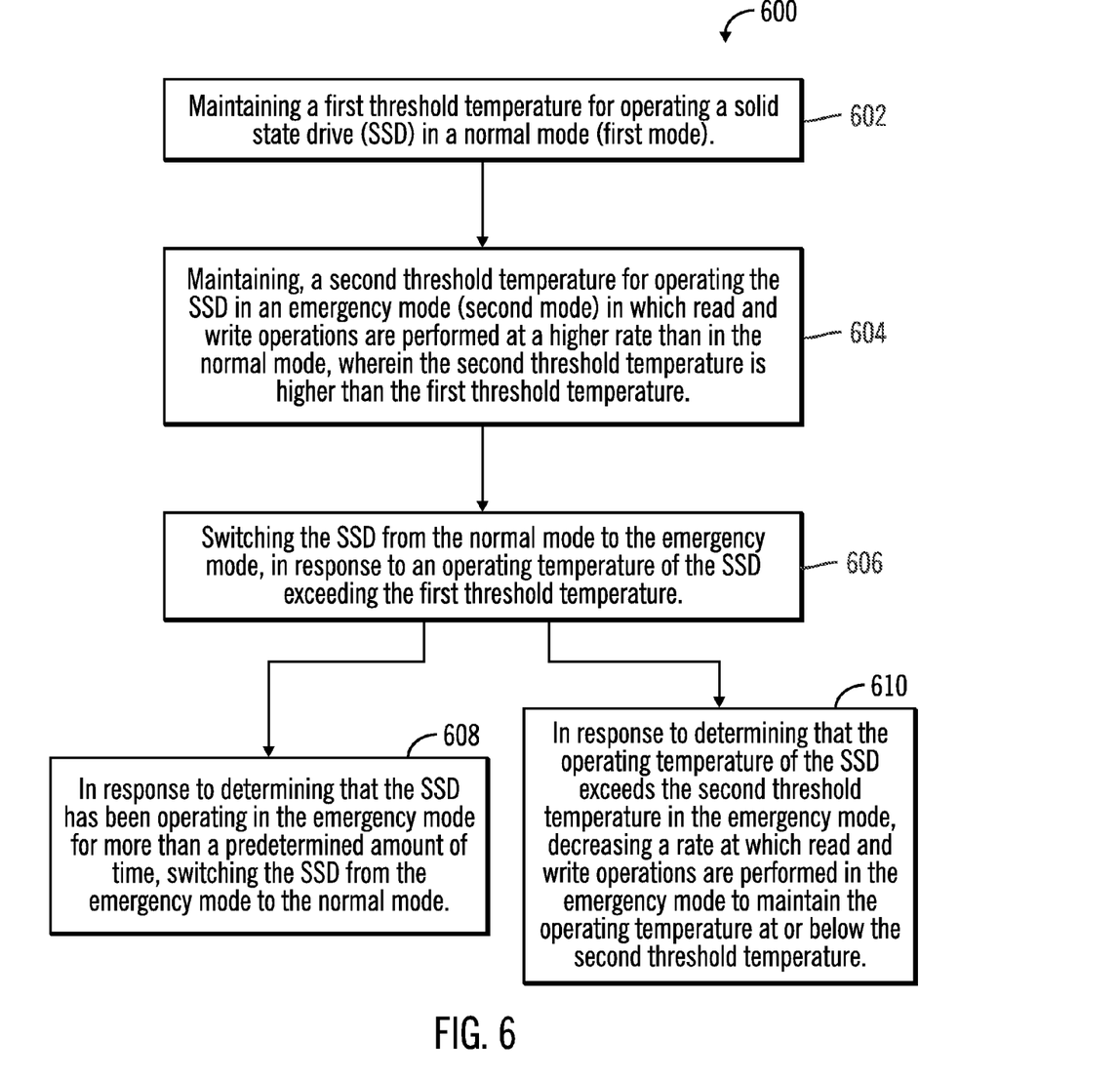
FIG. 6 illustrates a block diagram that shows additional operations performed by the SSD, in accordance with certain embodiments.

FIG. 6 illustrates a block diagram 600 that shows additional operations performed by the SSD 104, in accordance with certain embodiments. Certain of the operations shown in FIG. 6 may be performed by the controller 106 of the SSD 104.

Control starts at block 602 in which a first threshold temperature 120 (e.g., lower threshold temperature) is maintained for operating an SSD 104 in a normal mode 202 (e.g., a first mode). An second threshold temperature 122 (e.g., upper threshold temperature) is maintained (at block 604) for operating the SSD 104 in an emergency mode 204 (second mode) in which read and write operations are performed at a higher rate than in the normal mode 202, wherein the second threshold temperature 122 is higher than the first threshold temperature 120. The SSD 104 is switched (at block 606) from the normal mode to the emergency mode, in response to an operating temperature of the SSD 104 exceeding the first threshold temperature 120.

From block 606 control may proceed to block 608 and/or block 610. At block 608, in response to determining that the SSD 104 has been operating in the emergency mode 204 for more than a predetermined amount of time 124, the SSD 104 is switched from the emergency mode 204 to the normal mode 202. At block 610, in response to determining that the operating temperature of the SSD 104 exceeds the second threshold temperature 122 in the emergency mode 204, a rate at which read and write operations are performed is decreased in the emergency mode 204 to maintain the operating temperature at or below the second threshold temperature 122.

Therefore FIGS. 1-7 illustrate certain embodiments in which an SSD is made to move to an emergency mode of operation for no more than a predetermined period of time, where in the emergency mode of operation the SSD attempts to increase the rate of performing reads and writes in an attempt to rapidly complete pending I/O operations before moving back to the normal mode. The allowable temperature of the emergency mode is higher than the allowable temperature of the normal mode. While life expectancy is reduced in the emergency mode, the completion of the pending I/O operations in case of a potential looming shutdown of the SSD may be beneficial for maintaining the state of the data in a known state within the SSD. In certain alternative embodiments, no time limit is placed on the duration of time the SSD is allowed to operate in the emergency mode to complete pending I/O operations, provided the SSD is maintained at or below the allowable temperature of the emergency mode.

The described operations may be implemented as a method, apparatus or computer program product using standard programming and/or engineering techniques to produce software, firmware, hardware, or any combination thereof. The described operations may be implemented as code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMS, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Figure 7:
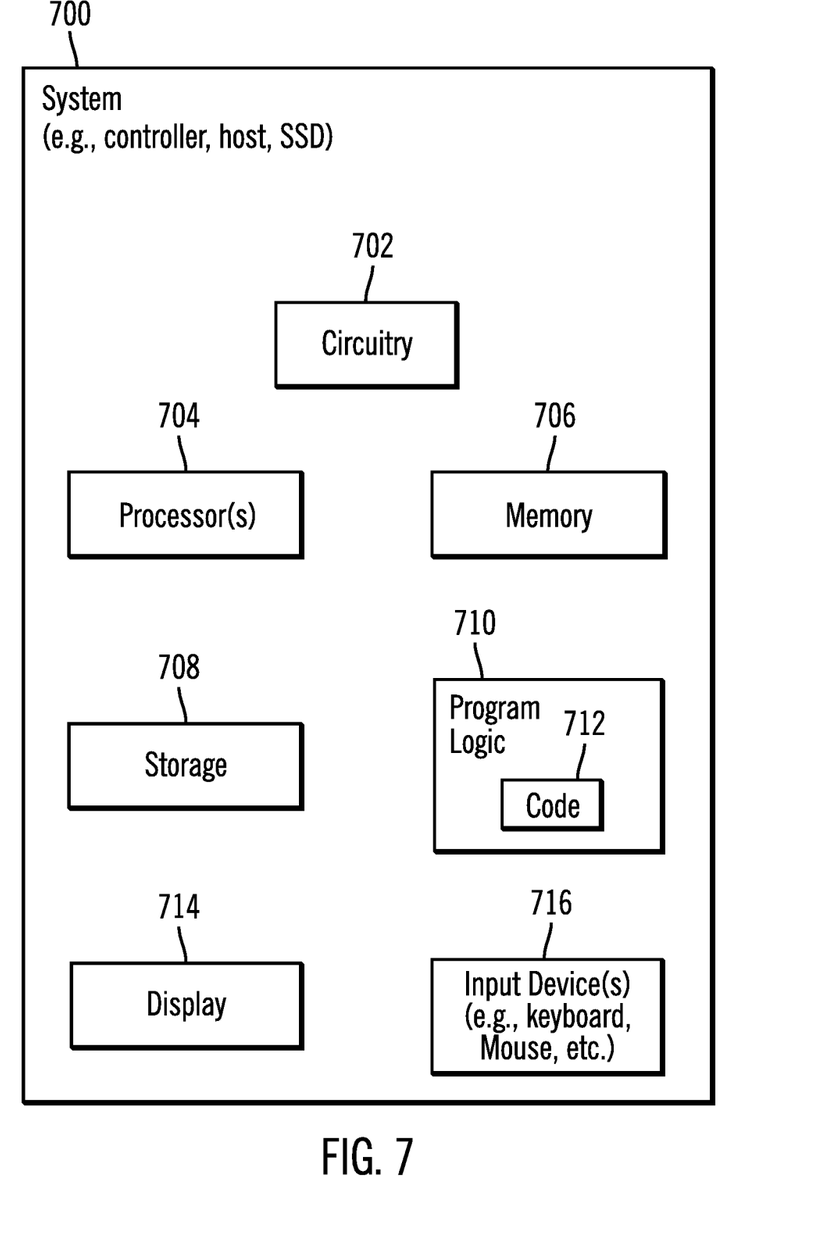
FIG. 7 illustrates a block diagram of a system comprising a controller, a host, or an SSD, in accordance with certain embodiments.

FIG. 7 illustrates a block diagram of a system 700 that corresponds to the controller 106, the host 102, the SSD 104, or a computational device, in accordance with certain embodiments. For example, in certain embodiments the system 700 may be a computer (e.g., a laptop computer, a desktop computer, a tablet, a cell phone or any other suitable computational device) that has the host 102 and the SSD 104 both included in the system 700. For example, in certain embodiments the system 700 may be a laptop computer that includes the SSD 104. The system 700 may include a circuitry 702 that may in certain embodiments include at least a processor 704, The system 700 may also include a memory 706 (e.g., a volatile memory device), and storage 708. The storage 708 may include the SSD 104 or other drives or devices including a non-volatile memory device (e.g., EEPROM, ROM, PROM, flash, firmware, programmable logic, etc.). The storage 708 may also include a magnetic disk drive, an optical disk drive, a tape drive, etc. The storage 708 may comprise an internal storage device, an attached storage device and/or a network accessible storage device. The system 700 may include a program logic 710 including code 712 that may be loaded into the memory 706 and executed by the processor 704 or circuitry 702. In certain embodiments, the program logic 710 including code 712 may be stored in the storage 708. In certain other embodiments, the program logic 710 may be implemented in the circuitry 702. Therefore, while FIG. 7 shows the program logic 710 separately from the other elements, the program logic 710 may be implemented in the memory 706 and/or the circuitry 702. The system 700 may also include a display 714 (e.g., an liquid crystal display (LCD), a light emitting diode (LED) display, a cathode ray tube (CRT) display, a touchscreen display, or any other suitable display). The system 700 may also include one or more input devices 716, such as, a keyboard, a mouse, a joystick, a trackpad, or any other suitable input devices. Other components or devices beyond those shown in FIG. 7 may also be found in the system 700.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as hawing such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

The following examples pertain to further embodiments.

Example 1 is a method for controlling operating modes for data storage, wherein the method comprises maintaining a first threshold temperature for operating a solid state drive (SSD) in a first mode; maintaining, a second threshold temperature for operating the SSD in a second mode in which read and write operations are performed at a higher rate than in the first mode, wherein the second threshold temperature is higher than the first threshold temperature; and switching the SSD from the first mode to the second mode, in response to an operating temperature of the SSD exceeding the first threshold temperature.

In example 2, the subject matter of example 1 may include that the first mode is a normal mode and the second mode is an emergency mode, wherein the SSD operates in the normal mode in response to the operating temperature of the SSD not exceeding the first threshold temperature.

In example 3, the subject matter of example 2 may include that in response to determining that the operating temperature of the SSD exceeds the second threshold temperature in the emergency mode, decreasing a rate at which read and write operations are performed in the emergency mode to maintain the operating temperature at or below the second threshold temperature.

In example 4, the subject matter of example 3 may include that in response to determining that the SSD has been operating in the emergency mode for more than a predetermined amount of time, switching the SSD from the emergency mode to the normal mode.

In example 5, the subject matter of example 2 may include that the switching to the emergency mode is performed in response to determining that the SSD has been configured to allow operation in the emergency mode, the method further comprising: in response to determining that the SSD has not been configured for operation in the emergency mode performing: lowering a rate at which read and write operations are performed in the SSD in the normal mode, in response to the operating temperature of the SSD exceeding the first threshold temperature.

In example 6, the subject matter of example 2 may include that the method further comprises collecting time and temperature statistics during the normal mode and the emergency mode to update a life expectancy of the SSD.

In example 7, the subject matter of example 2 may include that the switching of the SSD from the normal mode to the emergency mode allows the SSD to complete pending read and write operations at a faster rate than in the normal mode while decreasing life expectancy of the SSD by operating at a higher temperature than in the normal mode.

Example 8 is an apparatus for controlling operating modes for data storage, wherein the apparatus is comprised of a non-volatile memory; and a controller that controls the non-volatile memory, wherein the controller is operable to: maintain a first threshold temperature for operating the apparatus in a first mode; maintain, a second threshold temperature for operating the apparatus in a second mode in which read and write operations are performed at a higher rate than in the first mode, wherein the second threshold temperature is higher than the first threshold temperature; and switch the apparatus from the first mode to the second mode, in response to an operating temperature of the apparatus exceeding the first threshold temperature.

In example 9, the subject matter of example 8 may include that the apparatus is a solid state drive (SSD), and wherein the first mode is a normal mode and the second mode is an emergency mode, and wherein the SSD operates in the normal mode in response to the operating temperature of the SSD not exceeding the first threshold temperature.

In example 10, the subject matter of example 9 may include that the controller is further operable to: decrease a rate at which read and write operations are performed in the emergency mode to maintain the operating temperature at or below the second threshold temperature, in response to determining that the operating temperature of the SSD exceeds the second threshold temperature in the emergency mode.

In example 11, the subject matter of example 10 may include that the controller is further operable to: switch the SSD from the emergency mode to the normal mode, in response to determining that the SSD has been operating in the emergency mode for more than a predetermined amount of time.

In example 12, the subject matter of example 9 may include that the switch to the emergency mode is performed in response to determining that the SSD has been configured to allow operation in the emergency mode, wherein the controller is further operable to: in response to determining that the SSD has not been configured for operation in the emergency mode perform: lower a rate at which read and write operations are performed in the SSD in the normal mode, in response to the operating temperature of the SSD exceeding the first threshold temperature.

In example 13, the subject matter of example 9 may include that the controller is further operable to: collect time and temperature statistics during the normal mode and the emergency mode to update a life expectancy of the SSD.

In example 14, the subject matter of example 9 may include that the switch of the SSD from the normal mode to the emergency mode allows the SSD to complete pending read and write operations at a faster rate than in the normal mode while decreasing life expectancy of the SSD by operating at a higher temperature than in the normal mode.

Example 15 is a system for controlling operating modes for data storage, the system comprising: a display; a solid state drive (SSD) comprised of a non-volatile memory; and a controller that controls the non-volatile memory of the SSD, wherein the controller is operable to: maintain a first threshold temperature for operating the SSD in a first mode; maintain, a second threshold temperature for operating the SSD in a second mode in which read and write operations are performed at a higher rate than in the first mode, wherein the second threshold temperature is higher than the first threshold temperature; and switch the SSD from the first mode to the second mode, in response to an operating temperature of the SSD exceeding the first threshold temperature.

In example 16, the subject matter of example 15 may include that the first mode is a normal mode and the second mode is an emergency mode, wherein the SSD operates in the normal mode in response to the operating temperature of the SSD not exceeding the first threshold temperature.

In example 17, the subject matter of example 16 may include that the controller is further operable to: decrease a rate at which read and write operations are performed in the emergency mode to maintain the operating temperature at or below the second threshold temperature, in response to determining that the operating temperature of the SSD exceeds the second threshold temperature in the emergency mode.

In example 18, the subject matter of example 17 may include that the controller is further operable to: switch the SSD from the emergency mode to the normal mode, in response to determining that the SSD has been operating in the emergency mode for more than a predetermined amount of time.

In example 19, the subject matter of example 16 may include that the switch to the emergency mode is performed in response to determining that the SSD has been configured to allow operation in the emergency mode, wherein the controller is further operable to: in response to determining that the SSD has not been configured for operation in the emergency mode perform: lower a rate at which read and write operations are performed in the SSD in the normal mode, in response to the operating temperature of the SSD exceeding the first threshold temperature.

In example 20, the subject matter of example 16 may include that the controller is further operable to: collect time and temperature statistics during the normal mode and the emergency mode to update a life expectancy of the SSD.

In example 21, the subject matter of example 16 may include that the switch of the SSD from the normal mode to the emergency mode allows the SSD to complete pending read and write operations at a faster rate than in the normal mode while decreasing life expectancy of the SSD by operating at a higher temperature than in the normal mode.

Example 22 is a controller for controlling operating modes for data storage, wherein the controller is coupled to a non-volatile memory of a memory device, the controller comprising logic operable to: maintain a first threshold temperature for operating the memory device in a first mode; maintain, a second threshold temperature for operating the memory device in a second mode in which read and write operations are performed at a higher rate than in the first mode, wherein the second threshold temperature is higher than the first threshold temperature; and switch the memory device from the first mode to the second mode, in response to an operating temperature of the memory device exceeding the first threshold temperature.

In example 23, the subject matter of example 22 may include that the memory device is a solid state drive (SSD), wherein the first mode is a normal mode and the second mode is an emergency mode, and wherein the SSD operates in the normal mode in response to the operating temperature of the SSD not exceeding the first threshold temperature.

In example 24, the subject matter of example 23 may include that the logic is further operable to: decrease a rate at which read and write operations are performed in the emergency mode to maintain the operating temperature at or below the second threshold temperature, in response to determining that the operating temperature of the SSD exceeds the second threshold temperature in the emergency mode.

In example 25, the subject matter of example 24 may include that the logic is further operable to: switch the SSD from the emergency mode to the normal mode, in response to determining that the SSD has been operating in the emergency mode for more than a predetermined amount of time.

Example 26 is a system for controlling operating modes for data storage, the system comprising: means for maintaining a first threshold temperature for operating a solid state drive (SSD) in a first mode; means for maintaining, a second threshold temperature for operating the SSD in a second mode in which read and write operations are performed at a higher rate than in the first mode, wherein the second threshold temperature is higher than the first threshold temperature; and means for switching the SSD from the first mode to the second mode, in response to an operating temperature of the SSD exceeding the first threshold temperature.

What is claimed is:

1. A method, comprising:
   operating a memory device in a first mode;
   switching the memory device from operating in the first mode to operating in a second mode, in response to an operating temperature of the memory device exceeding a threshold temperature; and
   in response to determining that the memory device has been operating in the second mode for more than a predetermined amount of time, switching the memory device from the second mode to the first mode.

2. The method of claim 1, wherein the threshold temperature is a first threshold temperature that is lower than a second threshold temperature, the method further comprising:
   in response to determining that the operating temperature of the memory device exceeds the second threshold temperature while the memory device is operating in the second mode, decreasing a rate at which read and write operations are performed in the second mode.

3. The method of claim 1, wherein read and write operations are performed at a higher rate in the second mode than in the first mode.

4. A memory device, comprising:
   a non-volatile memory; and
   a controller that controls the non-volatile memory, wherein the controller is operable to:
   operate the memory device in a first mode;
   switch the memory device from operating in the first mode to operating in a second mode, in response to an operating temperature of the memory device exceeding a threshold temperature; and
   switch the memory device from the second mode to the first mode, in response to a determination that the memory device has been operating in the second mode for more than a predetermined amount of time.

5. The memory device of claim 4, wherein the threshold temperature is a first threshold temperature that is lower than a second threshold temperature, wherein the controller is further operable to:
decrease a rate at which read and write operations are performed in the second mode, in response to a determination that the operating temperature of the memory device exceeds the second threshold temperature while the memory device is operating in the second mode.

6. The memory device of claim 4, wherein read and write operations are performed at a higher rate in the second mode than in the first mode.

7. A system, comprising:
a display;
a memory device comprised of a non-volatile memory; and
a controller that controls the non-volatile memory of the memory device, wherein the controller is operable to:
operate the memory device in a first mode;
switch the memory device from operating in the first mode to operating in a second mode, in response to an operating temperature of the memory device exceeding a threshold temperature; and
switch the memory device from the second mode to the first mode, in response to a determination that the memory device has been operating in the second mode for more than a predetermined amount of time.

8. The system of claim 7, wherein the threshold temperature is a first threshold temperature that is lower than a second threshold temperature, wherein the controller is further operable to:
decrease a rate at which read and write operations are performed in the second mode, in response to a determination that the operating temperature of the memory device exceeds the second threshold temperature while the memory device is operating in the second mode.

9. The system of claim 7, wherein read and write operations are performed at a higher rate in the second mode than in the first mode.

10. A controller coupled to a non-volatile memory of a memory device, the controller comprising logic operable to:
operate the memory device in a first mode;
switch the memory device from operating in the first mode to operating in a second mode, in response to an operating temperature of the memory device exceeding a threshold temperature; and
switch the memory device from the second mode to the first mode, in response to a determination that the memory device has been operating in the second mode for more than a predetermined amount of time.

11. The controller of claim 10, wherein the threshold temperature is a first threshold temperature that is lower than a second threshold temperature, wherein the controller is further operable to:
decrease a rate at which read and write operations are performed in the second mode, in response to a determination that the operating temperature of the memory device exceeds the second threshold temperature while the memory device is operating in the second mode.

12. The controller of claim 10, wherein read and write operations are performed at a higher rate in the second mode than in the first mode.

13. A memory device, comprising:
a non-volatile memory; and
a controller that controls the non-volatile memory, wherein the controller is operable to:
operate the memory device in a first mode and in a second mode; and
collect time and temperature statistics during the first mode and the second mode to update a life expectancy of the memory device.

14. The memory device of claim 13, wherein read and write operations are performed at a higher rate in the second mode than in the first mode.

15. The memory device of claim 13, wherein the controller is further operable to:
switch the memory device from operating in the first mode to operating in a second mode, in response to an operating temperature of the memory device exceeding a threshold temperature.

16. The memory device of claim 13, wherein the controller is further operable to:
switch the memory device from the second mode to the first mode, in response to a determination that the memory device has been operating in the second mode for more than a predetermined amount of time.

17. The memory device of claim 13, wherein the memory device is a solid state drive.

18. A method, comprising:
operating a memory device in a first mode and in a second mode; and
collecting time and temperature statistics during the first mode and the second mode to update a life expectancy of the memory device.

19. The method of claim 18, wherein read and write operations are performed at a higher rate in the second mode than in the first mode.

20. A system, comprising:
a display;
a memory device comprised of a non-volatile memory; and
a controller that controls the non-volatile memory of the memory device, wherein the controller is operable to:
operate the memory device in a first mode and in a second mode; and
collect time and temperature statistics during the first mode and the second mode to update a life expectancy of the memory device.

21. The system of claim 20, wherein read and write operations are performed at a higher rate in the second mode than in the first mode.

22. The system of claim 20, wherein the memory device is a solid state drive.

23. A controller coupled to a non-volatile memory of a memory device, the controller comprising logic operable to:
operate the memory device in a first mode and in a second mode; and
collect time and temperature statistics during the first mode and the second mode to update a life expectancy of the memory device.

24. The controller of claim 23, wherein read and write operations are performed at a higher rate in the second mode than in the first mode.

25. The controller of claim 23, wherein the memory device is a solid state drive.

* * * * *